United States Patent
Welling et al.

(10) Patent No.: US 7,154,758 B2
(45) Date of Patent: Dec. 26, 2006

(54) METHOD AND SEMI-PRODUCT FOR PRODUCING A CHIP CARD WITH A COIL

(75) Inventors: Ando Welling, Isen (DE); Matthias Bergmann, Vogtareuth (DE); Joachim Hoppe, Munich (DE)

(73) Assignee: Giesecke & Devrient GmbH, Munich (DE)

( * ) Notice: Subject to any disclaimer, the term of this patent is extended or adjusted under 35 U.S.C. 154(b) by 296 days.

(21) Appl. No.: 10/477,138

(22) PCT Filed: May 7, 2002

(86) PCT No.: PCT/EP02/05030

§ 371 (c)(1),
(2), (4) Date: Jun. 8, 2004

(87) PCT Pub. No.: WO02/091292

PCT Pub. Date: Nov. 14, 2002

(65) Prior Publication Data

US 2004/0214364 A1    Oct. 28, 2004

(30) Foreign Application Priority Data

May 9, 2001    (DE) ................................ 101 22 416

(51) Int. Cl.
*H05K 1/11* (2006.01)
*H01L 23/12* (2006.01)

(52) U.S. Cl. ...................... 361/764; 361/782; 361/783; 257/679; 29/600; 29/601; 29/832; 29/842; 438/57; 438/59; 438/64

(58) Field of Classification Search ................ None
See application file for complete search history.

(56) References Cited

U.S. PATENT DOCUMENTS 5,880,934 A * 3/1999 Haghiri-Tehrani .......... 361/737
5,892,661 A * 4/1999 Stafford et al. ............. 361/737
6,412,702 B1 * 7/2002 Ishikawa et al. ............ 235/492

FOREIGN PATENT DOCUMENTS

EP    0 682 321 A2    11/1995
EP    0 996 082 A1    4/2000

* cited by examiner

*Primary Examiner*—John B. Vigushin
(74) *Attorney, Agent, or Firm*—Rothwell Figg Ernst & Manbeck

(57) ABSTRACT

The invention describes a method for producing chip cards with contactless and/or contact-type operation having a multilayer card body, an integrated circuit and at least one coil (2, 21) for data exchange and for power supply. The coil (2, 21) is applied to one or more layers (11) of the card body by printing technology, whereby after production of the printed coil a metal foil (4, 41) is placed over the coil terminals (32, 33) and laminated into the card body, thereby producing the connection between the contact areas (32, 33) of the printed coil and the metal foil (4, 41).

9 Claims, 2 Drawing Sheets

METHOD AND SEMI-PRODUCT FOR PRODUCING A CHIP CARD WITH A COIL

This application is a §371 of PCT Application Ser. No. PCT/EP02/05030, filed May 7, 2002.

This invention relates to a method and semifinished product for producing a chip card having a coil and/or contact areas for contactless and/or contact-type data exchange with external devices.

German laid-open print DE 44 16 697 A1 discloses a data carrier and a method for producing a data carrier wherein a coil is disposed within a single- or multilayer card structure for the purposes of energy supply and/or data exchange of the integrated circuit with external devices. The module comprising the integrated circuit has two contact elements that serve to connect with the contact areas of the coil. The coil is preferably a wire-wound coil, punched out of a metal foil or electroconductive plastic foil or consists of an etched copper coil and is applied to an insulating layer of the card body.

The electric connection between the contact areas of the coil and the contact areas of the integrated circuit is produced, or improved, by the use of conductive adhesive or anisotropic conductive adhesive in known contacting methods. Alternatively, the contact areas of the coils and integrated circuit are soldered. Preferably, flip-chip methods are used for this purpose.

Upon the use of printed coils, which advantageously also have printed coil terminal areas, it has turned out that the printed coils and terminal areas consisting of silver conductive paste do not enter into a reliable connection with anisotropic conductive adhesive, or the direct connection of dual interface modules with printed coils involves reliability problems during production and in operation. The problem therefore arises of specifying a chip card, a semifinished product and a method for producing the chip card or semifinished product that permit a reliable electric connection between coil and integrated circuit to be produced using a printed coil.

This problem is solved starting out from the features of the generic part of independent claims 1, 6 and 8 by the characterizing features of said claims.

Advantageous embodiments of the invention are stated in the dependent claims.

According to the invention, it is provided that after production of the printed coil on a carrier element, which can be for example a core foil within the structure of a laminated card, a metal foil is disposed that at least partly covers the coil terminal areas, a part of the metal foil coming to lie opposite the contact areas of the module to be later incorporated. The layer provided with the printed coil and metal foil is laminated into the card body. The laminating process presses the metal foil and the contact areas of the printed coil together, thereby producing an electric connection between printed coil and metal foil.

According to an advantageous embodiment of the invention, it is provided that conductive adhesive is disposed either on the coil contact areas or on the metal foil in the region of the coil contact areas or over the whole area. The arrangement of the conductive adhesive increases the reliability of the electric connection between the coil and the metal foil.

In particular in case the module is incorporated in the card body subsequently, it is provided that a gap is produced in the card body for incorporating the module, said gap being dimensioned so that the metal foil is exposed in the connecting region to the contact areas of the integrated circuit. Upon insertion of the module a terminal area for the coil opposite the contact areas is thus produced.

According to an advantageous embodiment of the invention, the gap for the module is milled. In this case it has proved favorable to slightly mill the metal foil in the connecting region to the contact areas of the integrated circuit. In this way a more reliable electric connection to the contact areas of the integrated circuit is obtained upon incorporation of the module.

The electric connection between the metal foil and the terminal areas of the integrated circuit can moreover be improved if an anisotropic conductive adhesive is incorporated between the two terminal areas. In this case the anisotropic conductive adhesive is advantageously already applied to the terminal areas of the integrated circuit. Upon lamination of the module into the card body the anisotropic conductive adhesive produces the electric connection with the metal foil.

The inventive method permits printed coils to be used in contactless cards or dual interface cards, whereby the reliability of the connection between integrated circuit and printed coil can be increased so that it is comparable to the connection reliability upon the use of etched copper coils for example.

The invention relates not only to the method for producing chip cards with contactless and/or contact-type operation but also to a semifinished product to be used for producing said chip cards. Said semifinished product consists of a carrier layer on which a printed coil having coil terminal areas at the coil ends is disposed. Over each of said coil terminal areas a metal foil is disposed that at least partly cover them and protrude further into the region where the integrated circuit or module is later to be incorporated.

Preferably, conductive adhesive is applied to the metal foil or the coil contact areas in the contacting region to produce a reliable connection between the metal foil and the coil contact areas. This is advantageous in particular when the semifinished product, i.e. the carrier foil with the printed coil and the metal foil, is processed only later.

In addition, the invention relates to a contactlessly operated chip card or a dual interface card wherein an inside layer of the card body has disposed thereon a printed coil whose terminal areas are covered with a metal foil that is disposed so as to be connected with the contact areas of the integrated circuit.

Advantageously, an anisotropic conductive adhesive is disposed between the metal foil and the contact areas of the integrated circuit. This has the advantage of increasing the connection reliability and the durability of the connection.

Hereinafter the invention will be explained in more detail with reference to FIGS. 1 to 4, in which:

FIG. 1 shows the front of chip card 1. It is assumed here that the cover layers are made of transparent material so that the inventive elements are recognizable.

Figure 1:
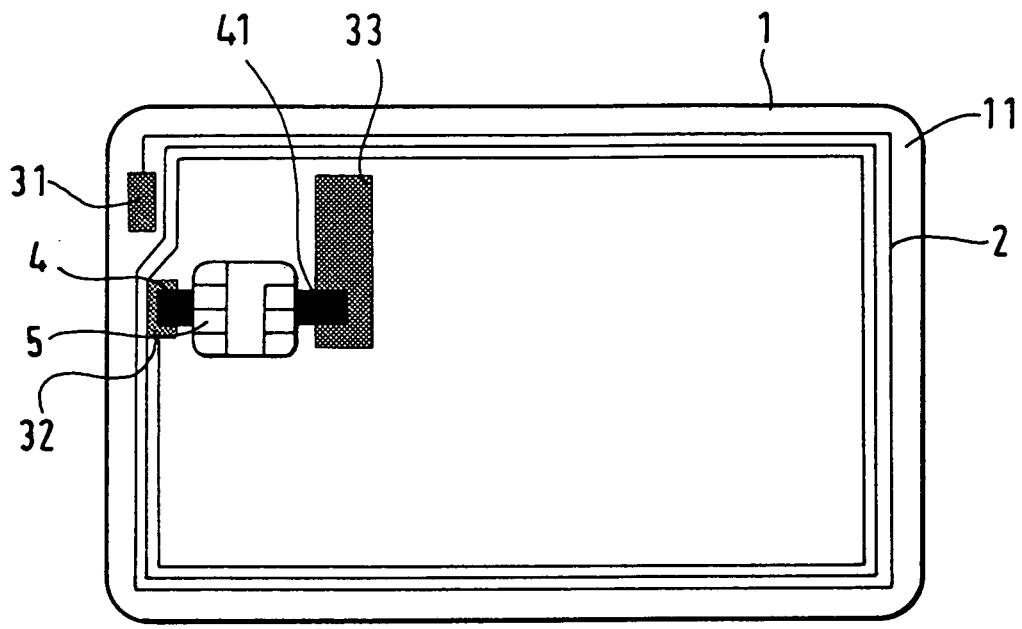
FIG. 1 shows the front of a dual interface card.

Coil 2 with terminal areas 31 and 32 is disposed in core layer 11 of card body 1. First coil terminal area 31 is for throughplating to coil terminal area 31' of coil 21 located on the back of core foil 11. FIG. 1 shows further terminal area 33 that is likewise throughplated to coil 21 on the back of the carrier element. Coil contact areas 32 and 33 serve to contact the coil with the terminal areas of the integrated circuit contained in module 5. This connection is effected not directly but via metal foils 4 or 41 partly covering terminal areas 32 and 33, respectively, and leading to the terminal areas of the integrated circuit in module 5.

Metal foils 4 and 41 are preferably made of copper, silver or silver-plated copper to guarantee good conductivity and reliable connection.

Figure 2:
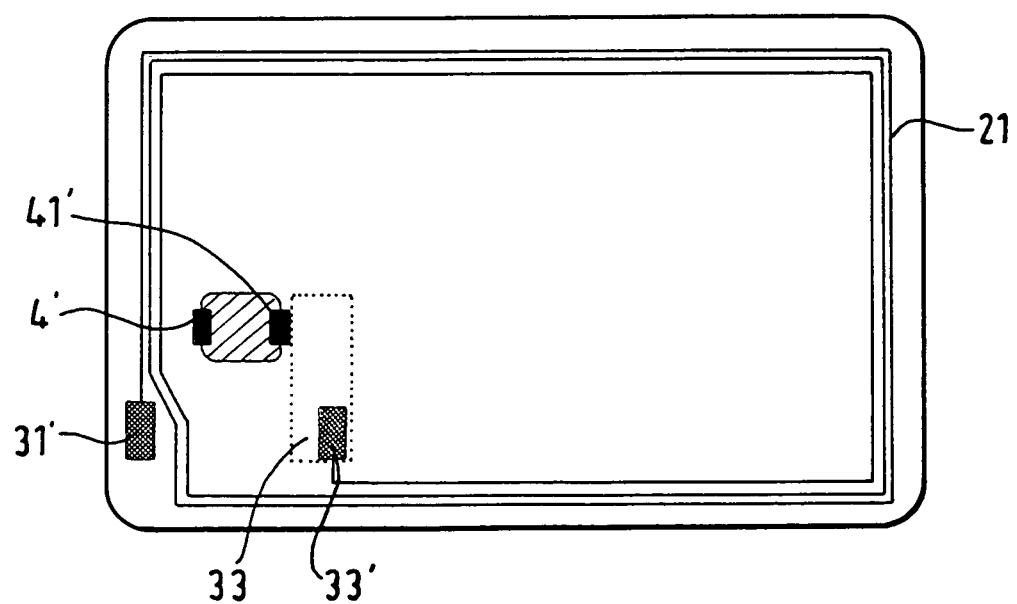
FIG. 2 shows the back of a dual interface card.

FIG. 2 shows the underside of card 1. This side bears the second part of coil 21 with terminal areas 31' and 33', said terminal areas each being throughplated to terminal areas 31 and 33 on the front. Terminal area 33 located on the front is shown by dotted lines in FIG. 2. As can be seen from FIG. 2, metal foils 4, 41 (FIG. 2 showing backs 4' and 41') lead to the terminal areas of the integrated circuit, which are not explicitly shown in the Figure.

Figure 3:
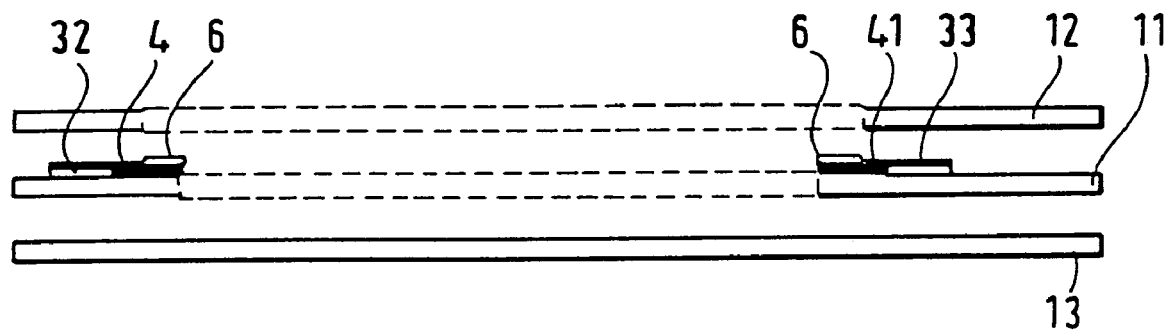
FIG. 3 shows the layer structure of a dual interface card according to the invention.

FIG. 3 shows a multilayer card structure in cross section. Said card structure consists of carrier foil 11 bearing coil 2 and 2' (not shown in FIG. 3) with coil terminal areas 31, 32, 33 and 31', 33'. Disposed over coil terminal areas 32 and 33 is metal foil 4, 4' which is advantageously connected with coil terminal areas 32 with an electroconductive adhesive.

In the region of the terminal areas of the integrated circuit, anisotropic conductive adhesive 6 is disposed in FIG. 3 for the purpose of connecting with module 5, i.e. terminal areas 7 of module 5. A conductive adhesive can likewise be disposed between metal foil 4 and coil terminal areas 32, 33.

Figure 4:
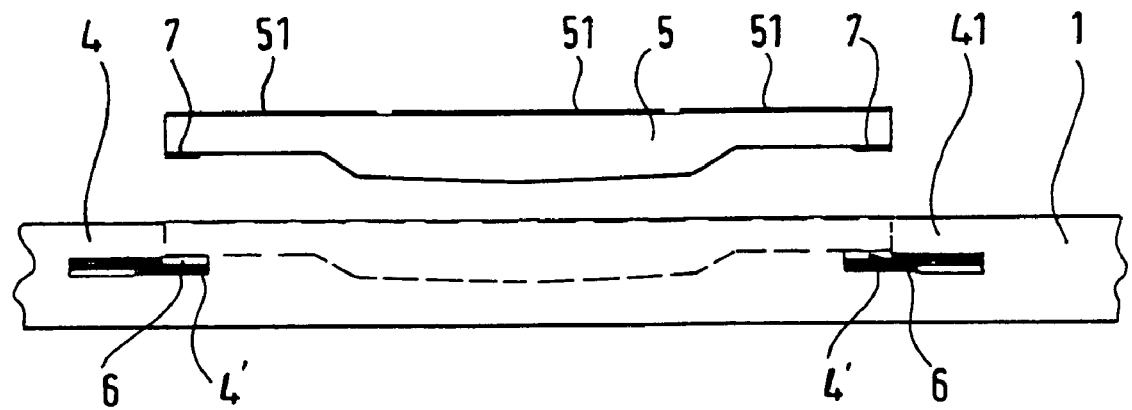
FIG. 4 shows a cross section of the card according to FIGS. 1, 2 and 3.

FIG. 4 shows a cross section of a card suitable for contactless and contact-type data exchange. Module 5 contains an integrated circuit which is not shown in the Figure. The integrated circuit can communicate with the outside world through contact areas 51 by contact-type data exchange. Contactless data exchange is effected using coil 2, 21, of which only terminal areas 32 and 33 are shown in the Figure. Contacting of coil 2, 21 with terminal areas 7 of the integrated circuit is effected through metal foils 4, 41 applied to coil terminal areas 32 and 33. For contacting it is preferable to use anisotropic conductive adhesive 6 that is either applied to foil 4, 41 before insertion of module 5, as shown in the Figure, or already disposed on contact areas 7 of the integrated circuit.

The invention claimed is:

1. A contactlessly operated chip card having a multilayer card body, an integrated circuit and at least one coil for data exchange and for power supply, the coil being applied to a layer of the card body by printing technology, characterized in that the printed coil is mounted on a core foil of the card body and has coil terminal contact areas that are covered by a metal foil, wherein said card body has a gap so dimensioned that the metal foil is exposed at least in a connecting region to the contact areas of the integrated circuit.

2. A semifinished product for producing contactlessly operated chip cards having a multilayer card body, an integrated circuit and at least one coil for data exchange and for power supply, the coil being applied to one or more layers of the card body by printing technology, characterized in that a printed coil having coil terminal areas that are likewise printed are disposed on a core foil on one or both sides, a metal foil being disposed over the coil terminal areas, wherein the metal foil is connected with the coil terminal areas by conductive adhesive.

3. A method for producing chip cards for contactless operation, contact-type operation or a combination thereof, having a multilayer card body, an integrated circuit and at least one coil for data exchange and for power supply, the coil having terminals and being applied to one or more layers of the card body by printing technology, characterized in that after production of the printed coil a metal foil is placed over the coil terminals and laminated into the card body, thereby producing a connection between contact areas of the printed coil and the metal foil, wherein a gap in the card body is produced for incorporating a module containing the integrated circuit, the gap being dimensioned so that the metal foil is exposed at least in the connecting region to the contact areas of the integrated circuit.

4. A method according to claim 3, characterized in that conductive adhesive is disposed on the coil contact areas or the metal foil in the region of the coil contact areas.

5. A method according to claim 4, characterized in that an anisotropic conductive adhesive is disposed between the metal foil and the terminal areas of the integrated circuit.

6. A method according to claim 3, characterized in that the gap for the module is milled, the metal foil being exposed or milled at least in the connecting region to the contact areas of the integrated circuit.

7. A method according to claim 6, characterized in that an anisotropic conductive adhesive is disposed between the metal foil and terminal areas of the integrated circuit.

8. A method according to claim 3, characterized in that an anisotropic conductive adhesive is disposed between the metal foil and the terminal areas of the integrated circuit.

9. A method according to claim 3, characterized in that an anisotropic conductive adhesive is disposed between the metal foil and terminal areas of the integrated circuit.

* * * * *